(12) United States Patent
Bilski et al.

(10) Patent No.: US 10,579,559 B1
(45) Date of Patent: Mar. 3, 2020

(54) STALL LOGIC FOR A DATA PROCESSING ENGINE IN AN INTEGRATED CIRCUIT

(71) Applicant: Xilinx, Inc., San Jose, CA (US)

(72) Inventors: Goran H K Bilski, Molndal (SE); Juan J. Noguera Serra, San Jose, CA (US); Jan Langer, Chemnitz (DE); Baris Ozgul, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/944,303

(22) Filed: Apr. 3, 2018

(51) Int. Cl.
*G06F 13/24* (2006.01)
*G06F 11/22* (2006.01)
*G06F 13/28* (2006.01)

(52) U.S. Cl.
CPC .......... *G06F 13/24* (2013.01); *G06F 11/2231* (2013.01); *G06F 13/28* (2013.01)

(58) Field of Classification Search
None
See application file for complete search history.

(56) References Cited

U.S. PATENT DOCUMENTS

| | | | |
|---|---|---|---|
| 3,776,137 A | 12/1973 | Abbott | |
| 5,535,417 A * | 7/1996 | Baji | G06F 13/28 710/22 |
| 6,091,263 A | 7/2000 | New et al. | |
| 6,150,839 A | 11/2000 | New et al. | |
| 6,204,687 B1 | 3/2001 | Schultz et al. | |
| 6,462,579 B1 | 10/2002 | Camilleri et al. | |
| 6,526,557 B1 | 2/2003 | Young et al. | |
| 6,759,869 B1 | 7/2004 | Young et al. | |
| 6,810,514 B1 | 10/2004 | Alfke et al. | |
| 6,836,842 B1 | 12/2004 | Guccione et al. | |
| 6,907,595 B2 | 6/2005 | Curd et al. | |
| 7,024,651 B1 | 4/2006 | Camilleri et al. | |
| 7,057,413 B1 | 6/2006 | Young et al. | |
| 7,124,338 B1 | 10/2006 | Mark et al. | |
| 7,224,184 B1 | 5/2007 | Levi et al. | |
| 7,302,625 B1 | 11/2007 | Payakapan et al. | |
| 7,477,072 B1 | 1/2009 | Kao et al. | |
| 7,478,357 B1 | 1/2009 | Mason et al. | |
| 7,482,836 B2 | 1/2009 | Levi et al. | |
| 7,509,617 B1 | 3/2009 | Young | |
| 7,518,396 B1 | 4/2009 | Kondapalli et al. | |
| 7,546,572 B1 | 6/2009 | Ballagh et al. | |
| 7,619,442 B1 | 11/2009 | Mason et al. | |

(Continued)

OTHER PUBLICATIONS

Mellanox, "BlueField Multicore System on Chip," copyright 2017, 4 pp., Mellanox Technologies, Sunnyvale, California, USA.

(Continued)

*Primary Examiner* — Scott C Sun
(74) *Attorney, Agent, or Firm* — Patterson + Sheridan, LLP

(57) ABSTRACT

An example data processing engine (DPE) for a DPE array in an integrated circuit (IC) includes a core, a memory including a data memory and a program memory, the program memory coupled to the core, the data memory coupled to the core and including at least one connection to a respective at least one additional core external to the DPE; support circuitry including hardware synchronization circuitry and direct memory access (DMA) circuitry each coupled to the data memory, and a stall circuit coupled to the core configured to stall or resume the core in response to one or more inputs.

19 Claims, 12 Drawing Sheets

(56) References Cited

U.S. PATENT DOCUMENTS

| | | |
|---|---|---|
| 7,640,527 B1 | 12/2009 | Dorairaj et al. |
| 7,724,815 B1 | 5/2010 | Raha et al. |
| 7,746,099 B1 | 6/2010 | Chan et al. |
| 8,102,188 B1 | 1/2012 | Chan et al. |
| 8,250,342 B1 | 8/2012 | Kostamov et al. |
| 8,359,448 B1 | 1/2013 | Neuendorffer |
| 8,415,974 B1 | 4/2013 | Lysaght |
| 8,719,750 B1 | 5/2014 | Balzli, Jr. |
| 8,796,539 B2 | 8/2014 | Asaumi et al. |
| 8,928,351 B1 | 1/2015 | Konduru |
| 9,081,634 B1 | 7/2015 | Simkins et al. |
| 9,722,613 B1 | 8/2017 | Schultz et al. |
| 2016/0191935 A1* | 6/2016 | Chao ............... H04N 19/172 375/240.25 |
| 2018/0276534 A1* | 9/2018 | Henry ............... G06N 3/0481 |

OTHER PUBLICATIONS

Mellanox, "NP-5 Network Processor," copyright 2107, 2 pp., Mellanox Technologies, Sunnyvale, California, USA.

Mellanox, "Tile-Gx672 Processor," PB041, Feb. 14, 2015, 2 pp., Mellanox Technologies, Sunnyvale, California, USA.

Kalray, "Kalray NVMe-oF Target Controller Solutions," Dec. 18, 2017, 14 pp., Kalray Inc., Los Altos, California, USA.

EZCHIP, "Tile-Gx72 Processor," PB041, Feb. 14, 2015, 2 pp., EZchip Semiconductor, Inc., San Jose, California, USA.

Schooler, Richard, "Tile Processors: Many-Core for Embedded and Cloud Computing," Sep. 15, 2010, 35 pp., 14th Annual Workshop on High Performance Embedded Computing (HPEC '10).

Doud, Bob, "Accelerating the Data Plane with the Tile-Mx Manycore Processor," Feb. 25, 2015, 19 pp., Linley Data Center Conference, EZchip Semiconductor, Inc., San Jose, California, USA.

Wentzlaff, David et al., "On-Chip Interconnection Architecture of the Tile Processor," IEEE Micro, Nov. 12, 2007, pp. 15-31, vol. 27, Issue 5, IEEE Computer Society Press, Los Alamitos, California, USA.

Kalray, "MPPA Processors for Autonomous Driving," May 25, 2017, 18 pp., Kalray Inc., Los Altos, California, USA.

Kalray, "Deep Learning for High-Performance Embedded Applications," 19 pp., Kalray Inc., Los Altos, California, USA.

Xilinx, UltraScale Architecture DSP Slice, UG579, Oct. 18, 2017, 74 pp., Xilinx, Inc., San Jose, California, USA.

\* cited by examiner

| 128-Bit | 256-Bit | 512-Bit | 1024-bit | |
|---|---|---|---|---|
| VRL0 | WR0 | XA | YA | |
| VRH0 | | | | |
| VRL1 | WR1 | | | |
| VRH1 | | | | |
| VRL2 | WR2 | XB | YD | |
| VRH2 | | | | |
| VRL3 | WR3 | | | |
| VRH3 | | | | |
| VCL0 | WC0 | XC | | |
| VCH0 | | | | |
| VCL1 | WC1 | | | |
| VCH1 | | | | |
| VDL0 | WD0 | XD | YD | |
| VDH0 | | | | |
| VDL1 | WD1 | | | |
| VDH1 | | | | |

STALL LOGIC FOR A DATA PROCESSING ENGINE IN AN INTEGRATED CIRCUIT

TECHNICAL FIELD

Examples of the present disclosure generally relate to electronic circuits and, in particular, to stall logic for a data processing engine in an integrated circuit (IC).

BACKGROUND

A processor, a system on a chip (SoC), and an application specific integrated circuit (ASIC) can include multiple cores for performing compute operations such as processing digital signals, performing cryptography, executing software applications, rendering graphics, and the like. In some examples, the cores may transmit data between each other when performing the compute operations. Typically, transferring data between cores requires the data to pass through a core-to-core interface that adds latency and is an inefficient use of memory.

SUMMARY

Techniques related to stall logic for a data processing engine in an integrated circuit (IC) are described. In an example, a data processing engine (DPE) for a DPE array in an integrated circuit (IC) includes: a core; a memory including a data memory and a program memory, the program memory coupled to the core, the data memory coupled to the core and including at least one connection to a respective at least one additional core external to the DPE; support circuitry including hardware synchronization circuitry and direct memory access (DMA) circuitry each coupled to the data memory; and a stall circuit coupled to the core configured to stall or resume the core in response to one or more inputs.

In another example, a method of operating a data processing engine (DPE) for a DPE array in an integrated circuit (IC) includes: operating a core and a memory in the DPE, the memory including a data memory and a program memory, the program memory coupled to the core, the data memory coupled to the core and including at least one connection to a respective at least one additional core external to the DPE; stalling the core and the memory using a stall circuit coupled to the core in response to one or more inputs; and resuming the core and the memory using the stall circuit.

In another example, n integrated circuit (IC) includes: a data processing engine (DPE) array having a plurality of DPEs, each of the plurality of DPEs comprising: a core; a memory including a data memory and a program memory, the program memory coupled to the core, the data memory coupled to the core and including at least one connection to a respective at least one additional core external to the DPE; support circuitry including hardware synchronization circuitry and direct memory access (DMA) circuitry each coupled to the data memory; a stall circuit coupled to the core configured to stall or resume core in response to one or more inputs.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 8 is a table showing an example configuration of vector register files according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
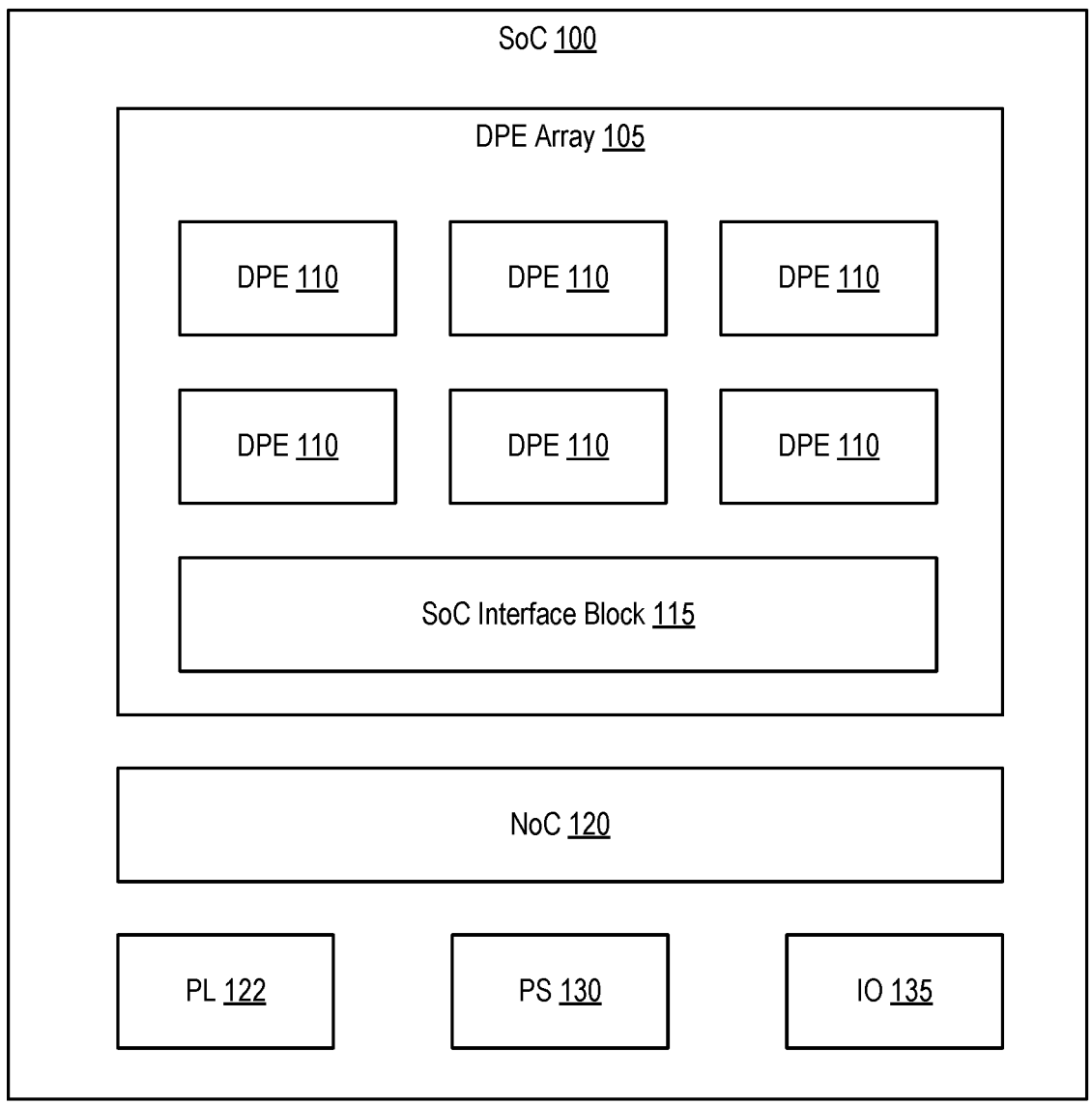
FIG. 1 is a block diagram of a System-on-Chip (SoC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram of a device 100 that includes a data processing engine (DPE) array 105, according to an example. In examples, device 100 is a System-on-Chip (SoC) type of device. In general, an SoC refers to an IC that includes two or more subsystems capable of interacting with one another. As an example, an SoC may include a processor that executes program code and one or more other circuits. The other circuits may be implemented as hardwired circuitry, programmable circuitry, other subsystems, and/or any combination thereof. The circuits may operate cooperatively with one another and/or with the processor. The DPE array 105 includes a plurality of data processing engines (DPEs) 110 that may be arranged in a grid, cluster, or checkerboard pattern in the device 100. Although FIG. 1 illustrates arranging the DPEs 110 in a 2D array with rows and columns, the examples are not limited to this arrangement. Further, the array 105 can be any size and have any number of rows and columns formed by the DPEs 110.

In one embodiment, the DPEs 110 are identical. That is, each of the DPEs 110 (also referred to as tiles or blocks) may have the same hardware components or circuitry. Further, the examples herein are not limited to DPEs 110. Instead, the device 100 can include an array of any kind of processing elements or data processing engines. Moreover, the DPEs 110 could be cryptographic engines or other specialized hardware for performing one or more specialized tasks. As such, the DPEs 110 can be referred to generally as data processing engines.

In FIG. 1, the array 105 includes DPEs 110 that are all the same type (e.g., a homogeneous array). However, in another embodiment, the array 105 may include different types of engines. For example, the array 105 may include DPEs 110, cryptographic engines, forward error correction (FEC) engines, and the like. Regardless if the array 105 is homogenous or heterogeneous, the DPEs 110 can include connections to memory modules in neighboring DPEs 110 which permit the DPEs 110 to share the memory modules as described in more detail below.

In one embodiment, the DPEs 110 are formed from non-programmable logic—i.e., are hardened. One advantage of doing so is that the DPEs 110 may take up less space in the device 100 relative to using programmable logic to form the hardware elements in the DPEs 110. That is, using hardened or non-programmable logic circuitry to form the hardware elements in the DPEs 110 such as program memories, an instruction fetch/decode unit, fixed-point vector units, floating-point vector units, arithmetic logic units (ALUs), multiply accumulators (MAC), and the like can significantly reduce the footprint of the array 105 in the device 100. Although the DPEs 110 may be hardened, this does not mean the DPEs 110 are not programmable. That is, the DPEs 110 can be configured when the device 100 is powered on or rebooted to perform different functions or tasks.

The DPE array 105 also includes an SoC interface block 115 that serves as a communication interface between the DPEs 110 and other hardware components in the device 100. In this example, the device 100 includes a network on chip (NoC) 120 that is communicatively coupled to the SoC interface block 115. Although not shown, the NoC 120 may extend throughout the device 100 to permit the various components in the device 100 to communicate with each other. For example, in a physical implementation, the DPE array 105 may be disposed in an upper right portion of the integrated circuit forming the device 100. However, using the NoC 120, the array 105 can nonetheless communicate with various subsystems, for example, programmable logic (PL) 120, a processor subsystem (PS) 130 or input/output (I/O) 135 which may disposed at different locations throughout the device 100.

In addition to providing an interface between the DPEs 110 and the NoC 120, the SoC interface block 115 may also provide a connection directly to a communication fabric in the PL 122. In one embodiment, the SoC interface block 115 includes separate hardware components for communicatively coupling the DPEs 110 to the NoC 120 and to the PL 122 that is disposed near the array 105 in the device 100.

Although FIG. 1 illustrates one block of PL 122, the device 100 may include multiple blocks of PL 122 (also referred to as configuration logic blocks) that can be disposed at different locations in the device 100. For example, the device 100 may include hardware elements that form a field programmable gate array (FPGA). However, in other embodiments, the device 100 may not include any PL 122—e.g., the device 100 is an ASIC.

Figure 2:
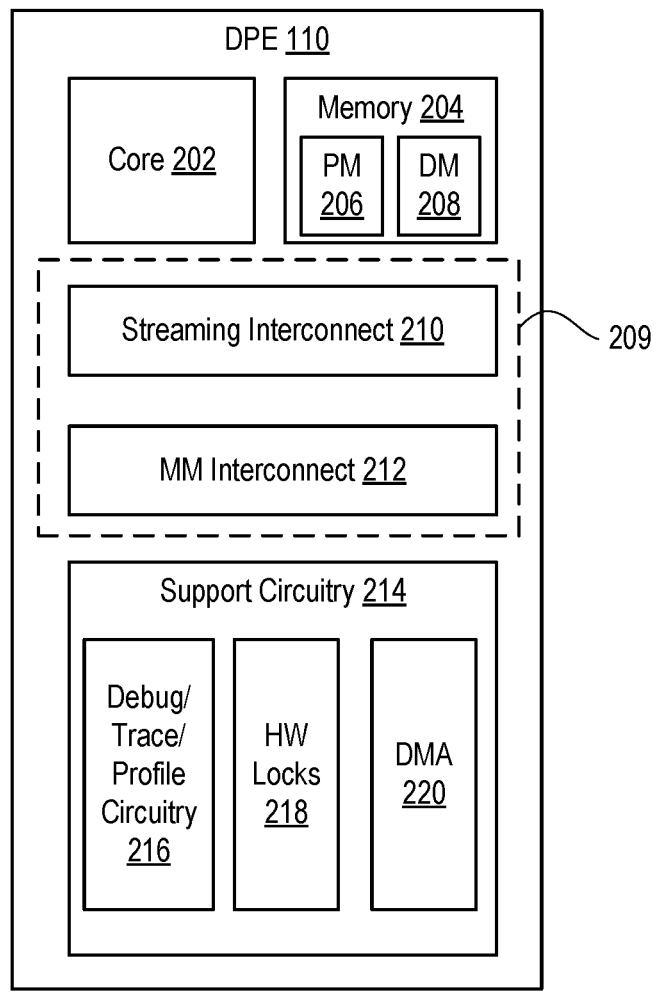
FIG. 2 is a block diagram depicting a tile circuit according to an example.

FIG. 2 is a block diagram depicting a DPE 110 according to an example. The DPE 110 can be used to implement a DPE in a DPE array as discussed above and shown in FIG. 1. The DPE 110 includes a core 202, memory 204, DPE interconnect 209, and support circuitry 214. The DPE interconnect 209 includes streaming interconnect 210 and memory-mapped (MM) interconnect 212. In an example, the support circuitry 214 includes debug/trace/profile circuitry 216, hardware (HW) synchronization circuitry ("HW locks 218"), and direct memory access (DMA) circuitry ("DMA 220"). The memory 204 includes program memory ("PM 206") and data memory ("DM 208").

The core 202 includes one or more compute units for processing data according to instruction(s) stored in the PM 206. In an example, the core 202 includes a very-long instruction word (VLIW) processor, a single instruction, multiple data (SIMD) or vector processor, or a VLIW SIMD/vector processor. In an example, the PM 206 is private to the core 202 (e.g., the PM 206 stores instruction(s) only for use by the core 202 in the DPE 200). In an example, the PM 206 comprises a single-ported random access memory (RAM). The PM 206 can be coupled to the MM interconnect 212 for configuration and loading of instructions. In an example, the PM 206 supports parity, error-correcting code (ECC) protection and reporting, or both parity and ECC. For example, the PM 206 can support 9-bit ECC and be able to correct a 1-bit error or 2-bit errors in a program instruction (e.g., 128 bits).

The core 202 can be directly coupled to the streaming interconnect 210 to receive input stream(s) and/or provide output stream(s). In addition, the core 202 can read and write data to the DM 208 in the DPE 200. As discussed further below, the core 202 in the DPE 200 can also access the DM in one or more neighboring tile circuits (e.g., north, south, east, and west neighboring tile circuits). In an example, as discussed further below, the core 202 can also include a direct connection with the data processing engine in one or more neighboring tiles for forwarding accumulator output (e.g., input and output cascading connection(s)). In an example, the core 202 sees the DM 208 in the DPE 200 and other DM(s) in neighboring tile(s) as one contiguous block of memory. The core 202 can also include an interface to the HW locks 218 and an interface to the debug/trace/profile circuitry 216. The debug/trace/profile circuitry 216 can include trace, debug, and/or profile circuitry.

The MM interconnect 212 can be an AXI memory-mapped interconnect or the like configured for transmission of data using address transactions between components. In an example, the MM interconnect 212 is used for configuration, control, and debugging functionality for the DPE 200. The MM interconnect 212 includes one or more switches that route transactions based on address. Circuitry can use the MM interconnect 212 to access the memory 204, the core 202, the DMA 220, and configuration registers in the DPE 200.

The streaming interconnect 210 can be an Advanced eXtensible Interconnect (AXI) streaming interconnect or the like configured for transmission of streaming data between components. The streaming interconnect 210 is used for transferring data between the DPE 200 and external circuits.

The streaming interconnect 210 can support both circuit switching and packet switching mechanisms for both data and control.

In an example, as described further below, the DM 208 can include one or more memory banks (e.g., random access memory (RAM) banks). The DMA 220 is coupled between the streaming interconnect 210 and the DM 208. The DMA 220 is configured to move data from the streaming interconnect 210 to the DM 208 and move data from the DM 208 to the streaming interconnect 210. In this manner, an external circuit (e.g., a circuit configured in programmable logic or a circuit in an embedded processing system of the IC) can read data from and write data to the DM 208 through the streaming interconnect 210 using DMA. The DMA 220 can be controlled through the MM interconnect 212 and/or the streaming interconnect 210. In an example, the DM 208 supports parity, error-correcting code (ECC) protection and reporting, or both parity and ECC. For example, the DM 208 can support 9-bit ECC (e.g., 128-bits data).

The HW locks 218 could be used to lock particular memory banks of the DM 208 for access by the core 202, another data processing engine in another tile, or the DMA 220. The HW locks 218 provide synchronization between neighboring data processing engines in neighboring tiles, between the core 202 and the DMA 220, and between the core 202 and an external circuit (e.g., an external processor). The HW locks 218 can also be used to lock a particular buffer in the DM 208, which may be stored in one or more memory banks or in a portion of a single memory bank. The debug/trace/profile circuitry 216 is configured to provide debug, trace, and profile functions. The debug/trace/profile circuitry 216 can trace events generated by circuits in the DPE 200. The debug/trace/profile circuitry 216 can provide profile functionality, for example, configurable performance counters.

Figure 3:
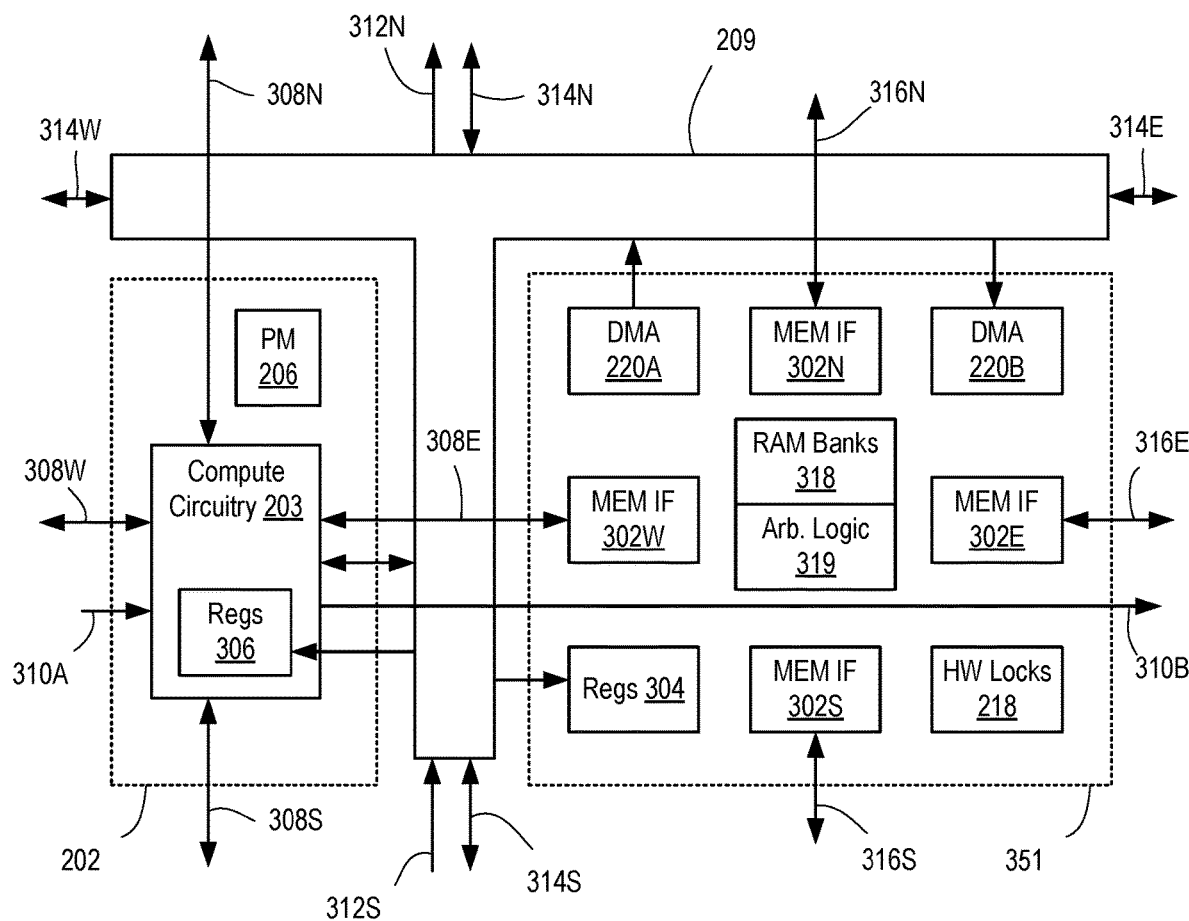
FIG. 3 is a block diagram depicting the tile circuit of FIG. 2 in more detail according to an example.

FIG. 3 is a block diagram depicting the DPE 200 in more detail according to an example. In the example, the DPE 200 includes core 202, a memory module 351, and DPE interconnect 209. The core 202 includes the compute circuitry 203 and the PM 206. The memory module 351 includes memory interfaces 302N, 302S, 302E, and 302W (collectively memory interfaces or individually "mem IF"), RAM banks 318, the HW locks 218, registers ("regs 304"), a DMA interface 204A, and a DMA interface 220B. The compute circuitry 203 includes registers ("regs 306"). The DPE interconnect 209 includes the MM interconnect 212 and the streaming interconnect 210 (shown in FIG. 2). Both the MM interconnect 212 and the streaming interconnect 210 can access the RAM banks 318. The RAM banks 318 include arbitration logic 319 per bank. The arbitration logic 319 is configured to control which interface (N, S, E, W, DMA, external PS, etc.) has access to which bank. Further details of the DPE interconnect 209 are discussed below with respect to the example of FIG. 4.

The DPE interconnect 209 includes a streaming connection 314W to a west tile, a streaming connection 314E to an east tile, a streaming connection 314N to a north tile, and a streaming connection 314S to a south tile. Each streaming connection 314 includes one or more independent streaming interfaces (e.g., busses), each having a specific bit width. The DPE interconnect 209 also includes a memory-mapped connection 312S from a south tile and a memory-mapped connection 312N to a north tile. Although only north and south MM connections are shown, it is to be understood that the DPE interconnect 209 can include other configurations for the MM interconnect (e.g., east-to-west, west-to-east, north-to-south, and the like). It is to be understood that the DPE interconnect 209 can include other arrangements of streaming and memory-mapped connections than shown in the example of FIG. 3. In general, the DPE interconnect 209 includes at least one streaming connection 314 and at least one memory-mapped connection 312.

The compute circuitry 203 includes a connection 308W to memory circuitry in a west tile, a connection 308S to memory circuitry in a south tile, a connection 308N to memory circuitry in a north tile, and a connection 308E to the memory module 351. The compute circuitry 203 include a streamlining interface to the DPE interconnect 209. The compute circuitry 203 also includes a connection 310A from a core in the west tile and a connection 310B to a core in the east tile (e.g., cascading connections). It is to be understood that the DPE can include other arrangements of memory and cascading connections than shown in the example of FIG. 3. In general, the compute circuitry 203 includes at least one memory connection and can include at least one cascading connection.

The mem IF 302W is coupled to the memory connection 308E of the compute circuitry 203. The mem IF 302N is coupled to a memory connection of the data processing engine in the north tile. The mem IF 302E is coupled to a memory connection of the data processing engine in the east tile. The mem IF 302S is coupled to a memory connection of the data processing engine in the south tile. The mem IF 302W, 302N, 302E, and 302S are coupled to the RAM banks 318. The DMA 220A includes an output coupled to the DPE interconnect 209 for handling memory to interconnect streams. The DMA 220B includes an input coupled to the DPE interconnect 209 for handling interconnect to memory streams. The regs 304 and the regs 306 are coupled to the DPE interconnect 209 to receive configuration data therefrom (e.g., using the memory-mapped interconnect).

Figure 4:
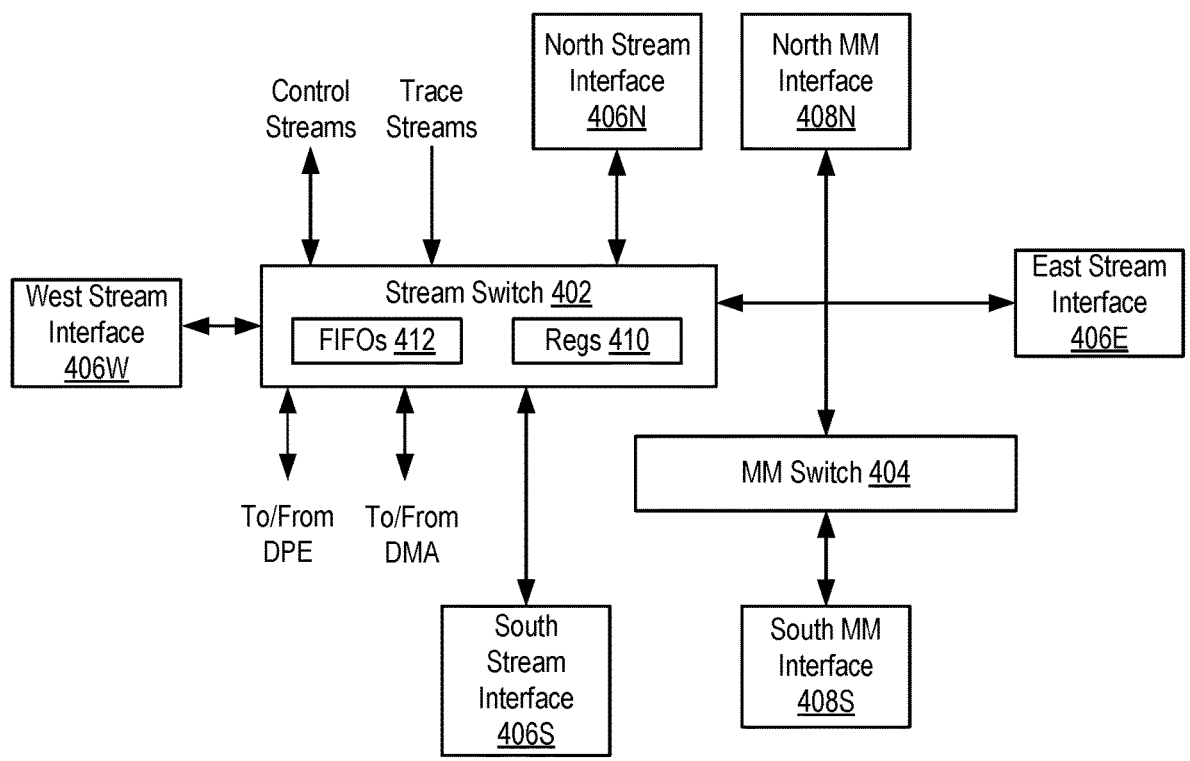
FIG. 4 is a block diagram depicting tile interconnect circuitry according to an example.

FIG. 4 is a block diagram depicting the DPE interconnect 209 according to an example. The DPE interconnect 209 includes a stream switch 402 and an MM switch 404. The stream switch 402 is coupled to a west stream interface 406W, a north stream interface 406N, an east stream interface 406E, and a south stream interface 406S. The west stream interface 406W receives and provides streams to the DPE interconnect of a west tile. The north stream interface 406N receives and provides streams to the DPE interconnect of a north tile. The west stream interface 406W receives and provides streams to the DPE interconnect of a west tile. The south stream interface 406S receives and provides streams to the DPE interconnect of a south tile. The MM switch 404 is coupled to a north MM interface 408N and a south MM interface 408S. The north MM interface 408N is coupled to the DPE interconnect in the north tile. The south MM interface 408S is coupled to the DPE interconnect in the south tile.

The stream switch 402 includes first-in-first-out (FIFO) circuits (FIFOs 412) and registers (regs 410). The FIFOs 412 are configured to buffer streams passing through the stream switch 402. The regs 410 store configuration data for the stream switch 402 that controls the routing of streams through the stream switch. The regs 410 can receive configuration data from the MM switch 404. The stream switch 402 can include an additional interface to the compute circuitry 203 and an additional interface to the DMA circuitry 220. The stream switch 402 can send and receive control streams and receive trace streams (e.g., from the debug/trace/profile circuitry 216).

Figure 5:
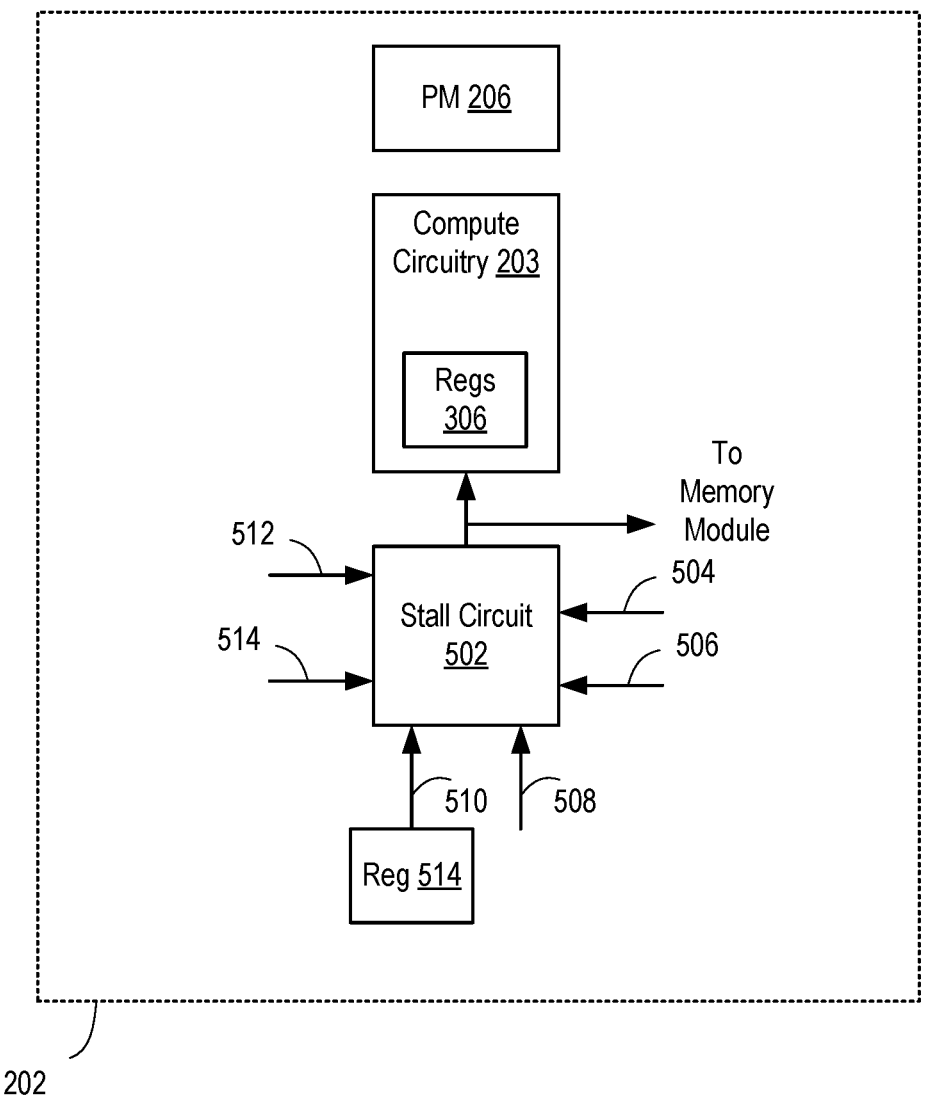
FIG. 5 is a block diagram depicting the processing circuitry 350 according to another example.
Figure 10:
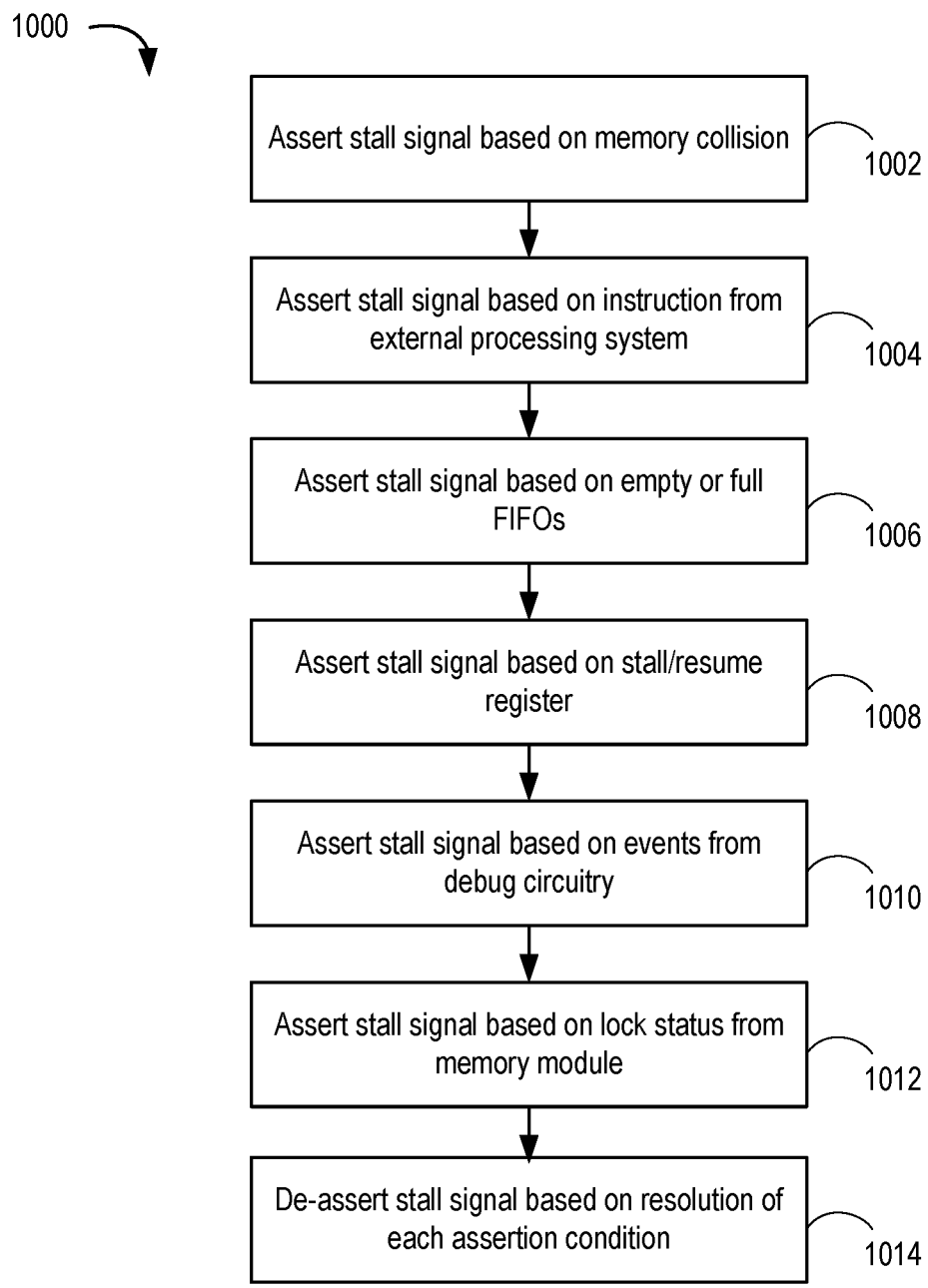
FIG. 10 is a flow diagram depicting operation of a stall circuit according to an example.

FIG. 5 is a block diagram depicting the core 202 according to another example. Elements in FIG. 5 that are the same or similar to those discussed above are designated with identical reference numerals. In the present example, the core 202 further includes a stall circuit 502. FIG. 10 is a flow diagram depicting operation of the stall circuit 502 according to an example.

Referring to FIGS. 5 and 10, the stall circuit 502 is coupled to the compute circuitry 203 and is configured to provide a stall signal. The stall circuit 502 also provides the stall signal to the memory module 351. The stall circuit 502 can assert the stall signal to stall the compute circuitry 203 (e.g., suspend operation of the compute circuitry 203 so that it does not process data). When the stall signal is de-asserted, the compute circuitry 203 is not stalled and processes data. The stall circuit 502 sets the state of the stall signal according to various inputs from circuits in the DPE 200 or circuits external to the DPE 200. In addition, once the stall circuit 502 stops the compute circuitry 203, the stall circuit 502 can stop other components of the DPE 200. For example, the stall circuit 502 can stop specific blocks in the memory module 351 that provide data to the compute circuitry 203. That is, since the compute circuitry 203 is stopped, data "in-flight" from the memory module 351 can be stalled to avoid data loss. In another example, the stall circuit 502 can perform a similar function for the program memory 206. That is, since the compute circuitry 203 is stopped, instructions "in-flight" from the program memory 206 can be stalled to avoid instruction loss.

In an example, the stall circuit 502 includes inputs 504, 506, 508, 510, 512, and 514. The input 504 is coupled to the arbitration logic 319 and is configured to receive a signal indicative of a memory collision (step 1002). For example, another data processing engine can be accessing a particular RAM bank 318 in the DPE 200, which would then be inaccessible to the compute circuitry 203. The arbitration logic 319 signals the stall circuit 502, which asserts the stall signal to stall the compute circuitry 203 and prevent the compute circuitry 203 from accessing the RAM bank 318 under contention.

The input 506 is coupled to the PS 130 and is configured to receive a control signal used to stall the compute circuitry 203 (step 1004). For example, software executing on the PS 130 can stall the compute circuitry 203 and resume the compute circuitry 203 on demand.

The input 508 is coupled to the stream switch 402 and is configured to receive a signal indicative of an empty or full condition of the FIFOs 412 (step 1006). For example, if the FIFOs 412 are full, the FIFOs 412 cannot store additional data output from the compute circuitry 203. Thus, the compute circuitry 203 is stalled to prevent overflow of the FIFOs 412. Once the FIFOs 412 are no longer full (e.g., at the empty condition), the compute circuitry 203 can be resumed.

The input 510 is coupled to a register 514 and is configured to receive a signal indicative of stall or resume (step 1008). In an example, the register 514 can be programmed through the MM interconnect 212 and allows for the user to program a stall or resume of the compute circuitry 203 through configuration of the array.

The input 512 is coupled to the debug/trace/profile circuitry 216 and is configured to receive a signal indicative of one or more events that require a stall of the compute circuitry 203 (step 1010). Event actions can include enable, disable single-step debug, and the like and can be configured to be triggered whenever a specific event occurs.

The input 514 is coupled to the HW locks 218 and is configured to receive a signal indicative of whether a RAM bank 418 has been locked for access by another circuit (e.g., another data processing engine) (step 1012). In such case, the compute circuitry 203 is stalled until the particular RAM bank 418 being accessed becomes free.

At step 1014, the stall circuit 502 de-asserts the stall signal in response to resolution of all conditions that caused assertion of the stall signal. That is, when each condition that causes assertion of the stall signal is resolved, the stall circuit 502 de-asserts the stall signal to resume full operation of the DPE.

Figure 6:
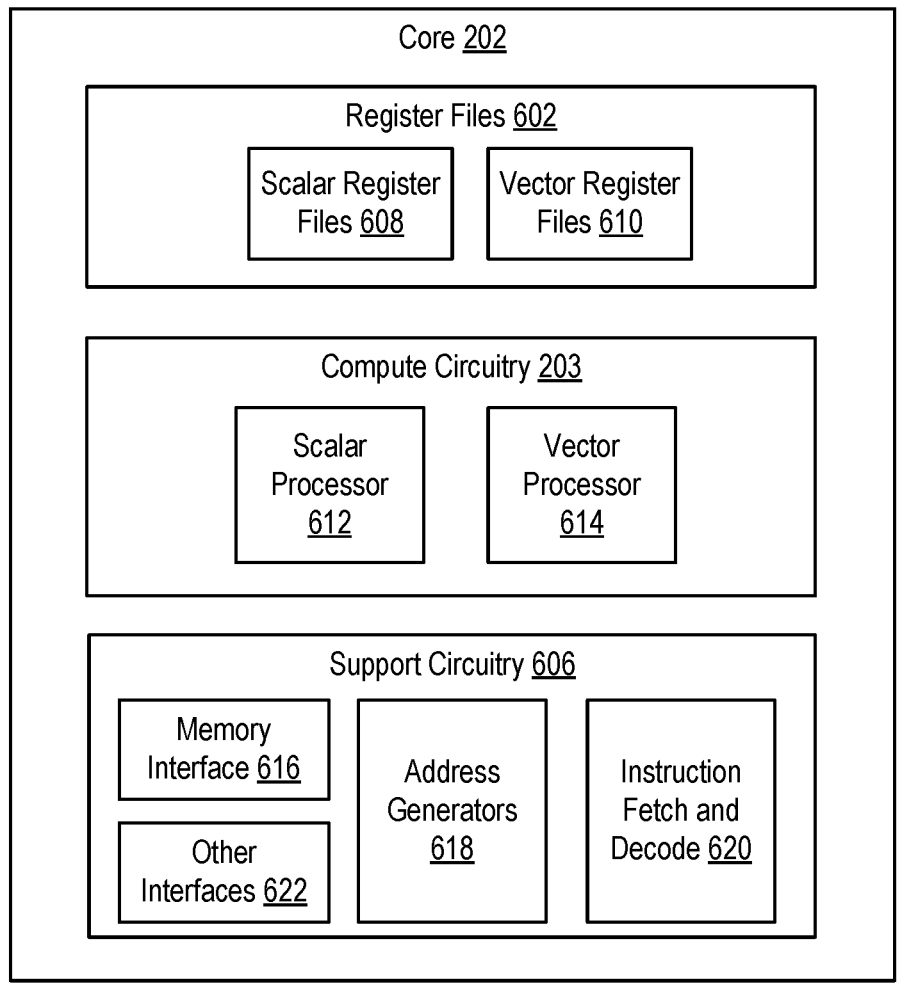
FIG. 6 is a block diagram depicting a data processing engine according to an example.

FIG. 6 is a block diagram depicting the core 202 according to an example. The core 202 includes register files 602, the compute circuitry 203, and support circuitry 606. The register files 602 include scalar register files 608 and vector register files 610. The scalar register files 608 include general purpose registers, pointer registers, modifier registers, configuration registers, and the like. The vector register files 610 include high-width registers (as compared to the scalar registers) that support SIMD instructions for a vector data path. The vector register files 610 can include vector registers, accumulator registers, and the like. The register files 602 can include other types of registers, such as a program counter, stack pointer, link register, various configuration, control and status registers, and the like.

The compute circuitry 203 includes a scalar processor 612 and a vector processor 614. The scalar processor 612 is configured to perform scalar arithmetic, including signed and unsigned multiplication, add/subtract, shifts, compares, and logical operations, elementary functions, such as square-root, sine/cosine, and the like. The vector processor 614 is configured to perform vector arithmetic, including permute functions, pre-addition functions, multiplication functions, post-addition functions, accumulation functions, shift, round and saturate functions, upshift functions, and the like. The vector processor 614 supports multiple precisions for complex and real operands. The vector processor 614 can include both fixed-point and floating-point data paths.

The support circuitry 606 includes a memory interface 616, address generators 618, instruction fetch and decode circuitry 620, and one or more additional interfaces 622. The instruction fetch and decode circuitry 620 is configured to fetch instructions from the PM 206, decode the fetched instructions, and provide control signals to the processor 604 to control operation thereof according the decoded instructions. The address generators 618 are configured to generate addresses for data memory to load data from or store data to the data memory. The memory interface 616 is configured to communicate with data memory to send data to and receive data from data memory according to the decoded instructions and the addresses generated by the address generators 618. The other interfaces 622 can include an interface to the HW locks 218, an interface to the streaming interconnect 210, an interface to receive cascade stream(s) from other data processing engines, an interface to the debug/trace/profile circuitry 216, and the like.

Figure 7:
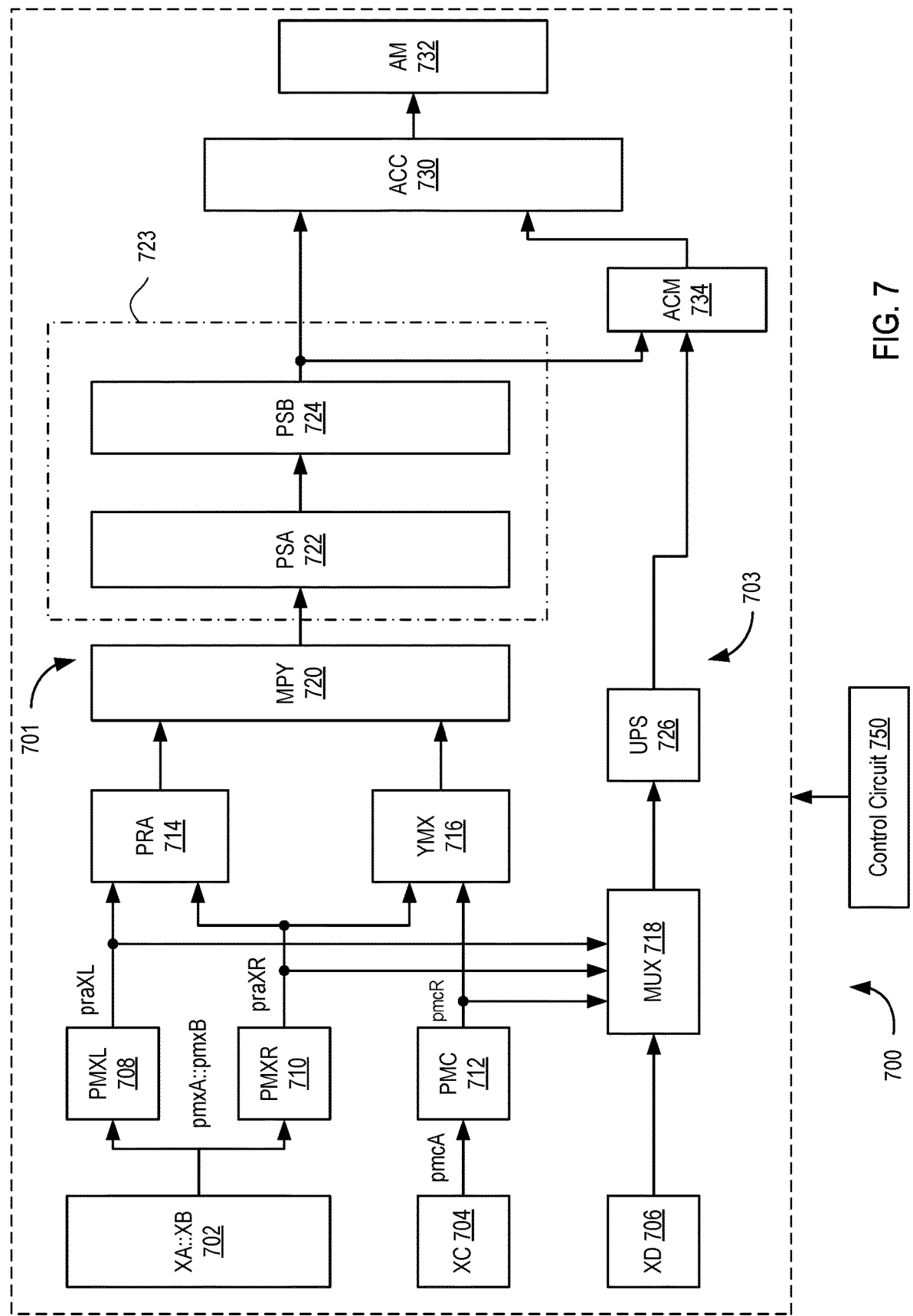
FIG. 7 is a block diagram depicting a pipeline in a vector processor according to an example.

FIG. 7 is a block diagram depicting a pipeline 700 in the vector processor 614 according to an example. The pipeline 700 is configured to perform fixed-point vector processing and includes a multiply-accumulate (MAC) path 701 and an upshift path 703. The MAC path 701 reads values from vector registers, permutes them in a user-controllable fashion, performs optional pre-adding, multiplies them after some post-adding, and accumulates them to the previous value of the accumulation register. The upshift path 703 operates in parallel to the MAC path 701 and is configured to read vectors, upshift them, and feed the result into the accumulator. The pipeline 700 further includes a control circuit 750 configured to control the various circuits in the MAC path 701 and the upshift path 703, as discussed further below.

FIG. 8 is a table 800 showing an example configuration of vector register files 610 according to an example. As shown in the table 800, the core 202 includes three separate vector register files denoted R, C, and D, with an additional prefix specifying their width. In the example, the underlying hardware registers are each 128-bits wide. The hardware registers are prefixed with the letter "V" (for vector). Two "V" registers can be grouped together to form a 256-bit register, which is prefixed with a "W" (for wide vector). Furthermore, the WR, VC, and WD registers can be grouped pairwise to form a 512-bit wide register (XA, XB, XC, and XD). Finally, the registers XA and XB together form a 1024-bit wide YA register, whereas XD and XB form a partially overlapping 1024-bit wide YD register. In YD, the XD register is the LSB part and the XB register is the MSB part.

The vector registers in the vector register files 610 can store data in different formats. For example, the 128-bit registers can be used to represent 16 lanes of 8-bit signed data (v16int8), 16 lines of 8-bit unsigned real data (v16uint8), 8 lanes of 16-bit signed data (v8int16), 4 lanes of 16-bit complex data (v4cint16), and 2 lanes of 32-bit complex data (v2cint32).

The table 800 shown in FIG. 8 depicts just one possible configuration of the vector register files 610. For example, the vector register files 610 can include less or more than 16 hardware registers, which can have any bit width, and which can be grouped into larger registers also having different bit widths than shown. Various register files can be combined to provide a smaller number of larger registers, for example. Alternatively, various registers can be divided into a larger number of smaller registers.

Returning to FIG. 7, the pipeline 700 includes a register file 702 (formed from a concatenation of XA and XB), a register file 704 (XC), and a register file 706 (XD). In the example of FIG. 8, the register file 702 includes eight 128-bit hardware registers, the register file 704 includes four 128-bit hardware registers, and the register file 706 includes four 128-bit hardware registers. In other examples, the register files 702, 704, and 706 can include other numbers of registers having different bit-widths. The configuration of register files 702, 704, and 706 is one example. In another example, the register files 702, 704, and 706 can be unified into a single register file. In other examples, the pipeline 700 can include more than three register files.

The pipeline 700 further includes the MAC path 701 having a permute circuit 708 (PMXL), a permute circuit 710 (PMXR), a permute circuit 712 (PMC), a pre-adder 714, a special operation circuit 716 (YMX), a multiplier 720 (MPY), a post-adder 723, an accumulator 730 (ACC), and an accumulation register file 732 (AM). In an example, the post-adder 723 includes two separate stages, i.e., a post-adder 722 and a post-adder 724. The pipeline 700 includes the upshift path 703 having a multiplexer 718 (MUX), an upshift circuit 726 (UPS), and an accumulator multiplexer 734 (ACM). While three permute circuits 708, 710, and 712 are shown in the example, in other examples, the pipeline 700 can include a single permute circuit that incorporates the functionality of the permute circuits 708, 710, and 712.

An input of the permute circuit 708 is coupled to outputs of the register file 702, an input of the permute circuit 710 is coupled to the outputs of the register file 702, and inputs of the permute circuit 712 is coupled to outputs of the register file 704. A first input of the pre-adder 714 is coupled to an output of the permute circuit 708 and a second input of the pre-adder 714 is coupled to an output of the permute circuit 710. A first input of the special operation circuit 716 is coupled to the output of the permute circuit 710, and a second input of the special operation circuit 716 is coupled to an output of the permute circuit 712. Outputs of the pre-adder 714 and the special operation circuit 716 are coupled to inputs of the multiplier 720. An output of the multiplier 720 is coupled to an input of the post-adder 722. An output of the post-adder 722 is coupled to an input of the post-adder 724. An output of the post-adder 724 is coupled to an input of the accumulator 730. An output of the accumulator 730 is coupled to an input of the register file 732.

In an example, the register file 702 contains a 1024-bit vector (e.g., a concatenation of XA::XB, each of which is 512-bits). An input (pmxA) to the permute circuits 708 and 710 can be 512 bits. Likewise, another input (pmxB) to the permute circuits 708 and 710 can be 512 bits. Thus, each permute circuit 708 and 710 receives a concatenation of pmxA::pmxB from the register file 702 (e.g., 1024 bits).

The permute circuit 708 is configured to permute the data from the register file 702 for the "left" input of the pre-adder 714. The permute circuit 710 is configured to permute the data from the register file 702 for the "right" input of the pre-adder 714 or alternatively for the first input of the special operation circuit 716. The permute circuit 712 is configured to permute the data from the register file 704 for input to the special operation circuit 716. In an example, the permute circuits 708 and 710 are functionally identical. Operation of the permute circuits 708, 710, and 712 as a data selection network for the vector processor 614 is discussed further below. The permute circuit 708 includes an output (praXL), which can be 512-bits. The permute circuit 710 includes an output (praXR), which can also be 512-bits. The permute circuit 712 includes an output pmcR, which can also be 512-bits. Each of the permute circuits 708, 710, and 712 can receive a control signal from the control circuit 750 for operation, as discussed below.

The pre-adder 714 can operate in multiple modes based on a control signal from the control circuit 750. In a first mode, the pre-adder 714 feeds through the input data (praXL::praXR) to the multiplier 720. In the first mode, no pre-addition is performed. In a second mode, the pre-adder 714 can add/subtract the output (praXL) of the permute circuit 708 with the output (praXR) of the permute circuit 710. The special operation circuit 716 can operate in multiple modes. In a first mode, the special operation circuit 716 feeds through the input data to the multiplier 720 (praXR::pmcR). In additional modes, the special operation circuit 716 can output a constant value, perform sign extension of the input data, and the like type manipulation of the input data.

The multiplier 720 is configured to multiply the output of the pre-adder 714 by the output of the special operation circuit 716. The multiplier 720 can include an array of multiplier circuits configured to multiple different portions of the output of the pre-adder 714 with different portions of the output of the special operation circuit 716. The operation of the multiplier 720 is determined by a control signal from the controller 750. The post-adder 722 is configured to reduce the output lanes of the multiplier 720 by adding/subtracting particular lanes. For example, the post-adder 722 can take neighboring even lanes and neighboring odd lanes and adds them (or subtracts them). The post-adder 722 is configured to operate in different modes. In a first mode, the post-adder 722 passes the output from the post-adder 722 and performs no additional function. That is, the post-adder 724 is optionally included in the processing of the pipeline 700. In a second mode, the post-adder 724 performs a similar function as the post-adder 722. For example, the post-adder 724 can take neighboring even lanes and neighboring odd lanes and adds them (or subtracts them). The accumulator 730 is configured to accumulate (e.g., add or subtract) the output of the post-adder 724. The functionality of the post-adder 722, the post-adder 724, and the accumulator (for add or subtract) is determined by control signals from the control circuit 750. The output of the accumulator is stored in the register file 732.

The upshift path 703 operates in parallel to the MAC path 701. The upshift path 703 can read data from the register file 706, or from any of the permute circuits 708, 710, and 712 via the multiplexer 718. The upshift circuit 726 is configured to shift the output of the multiplexer 718 (e.g., left-shift) by a selectable amount under control of the control circuit 750. The multiplexer 734 selects either the output of the upshift circuit 726 or the output of the post-adder 724 for coupling to the accumulator 730. The upshift path 703 can be used to initialize the accumulator 730 with a value before processing.

Figure 9:
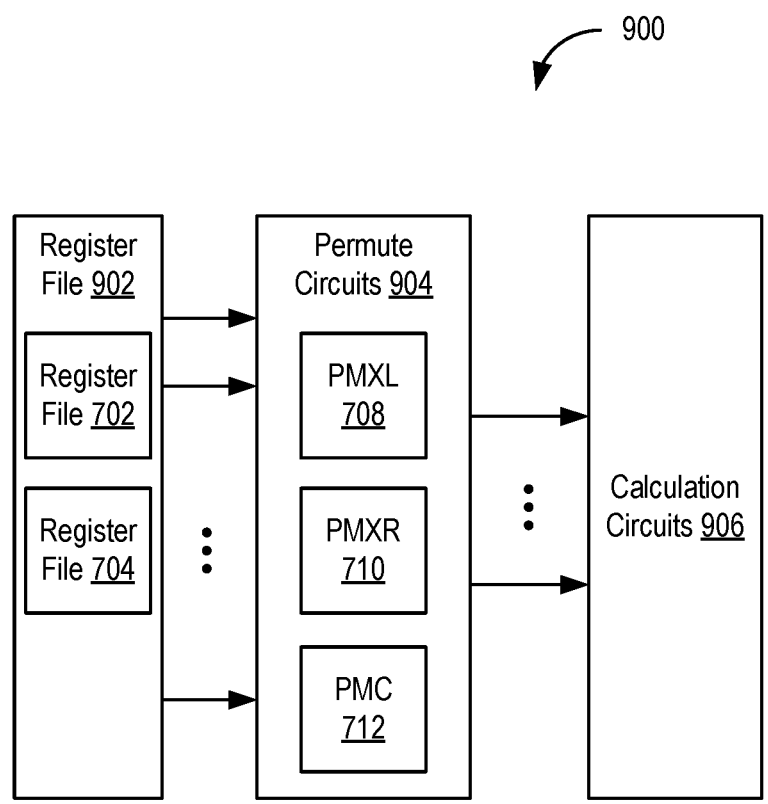
FIG. 9 is a block diagram depicting a logical view of the pipeline for the vector processor shown in FIG. 7 according to an example.

FIG. 9 is a block diagram depicting a logical view 900 of the pipeline 700 for the vector processor 614 according to an example. The logical view 900 shows a register file 902, permute circuits 904, and calculation circuits 906. The register file 902 is coupled to the calculation circuits 906 by the permute circuits 904. The register file 902 can include, for example, the register configuration shown in FIGS. 7 and 8 (or any other register configuration). The calculation circuits 906 include pre-adders, special operation circuits, multipliers, post-adders, accumulators, and the like configured to process data in the register file 902. An example of the calculation circuits 906 is shown in FIG. 7 and described above (e.g., the circuits of the MAC path 701). The permute circuits 904 function as a data selection network for the calculation circuits 906.

In an example, the register file 902 includes the register file 702 and the register file 704, as discussed above. In an example, the permute circuits 904 include the permute circuits 708, 710, and 712, described above. Each register file 702 and 704 provides a plurality of output lanes, where each lane includes M-bits (e.g., 32 lanes each 32-bits each). The permute circuit 708 is coupled to the register file 702 and is configured to generate a vector by selecting a set of the output lanes provided by the register file 702. The permute circuit 710 is also coupled to the register file 702 and is configured to generate another vector by selecting a set of the output lanes provided by the register file 702 (e.g., a potentially different set than that selected by the permute circuit 708). Similar to the register file 702, the register file 704 is configured to provide a plurality of output lanes (e.g., a different number than the register file 702). The permute circuit 712 is coupled to the register file 704 and is configured to generate another vector by selecting a set of output lanes thereof. The outputs of the permute circuits 904 are provided to the calculation circuits 906, which perform, for example, MAC operations thereon.

In an example, each permute circuit 708 and 710 is configured to select 16 chunks of 32-bits each from one of thirty-two 32-bit lanes of an input vector. The 16 output lanes of 32-bit each form the 512-bit output vector. Each permute circuit 708 and 710 is a full multiplexer and can select any input. In an example, each permute circuit 708 and 710 can be implemented using a series of 16 multiplexers that are 32-bits wide and select from 32 different source lanes. Alternative structures can be used, such as Benes networks and the like. The permute circuit 712 is functionally similar to the permute circuits 708 and 710, but in an example only selects from an input vector of 256-bits in width. The selection granularity is 16-bits, hence each lane of the multiplier can be selected individually. Note that the numbers, widths, etc. discussed above for the permute circuits 708, 710, and 712 are exemplary and they can be configured with different widths, to select from different numbers of lanes, having different widths.

Figure 11:
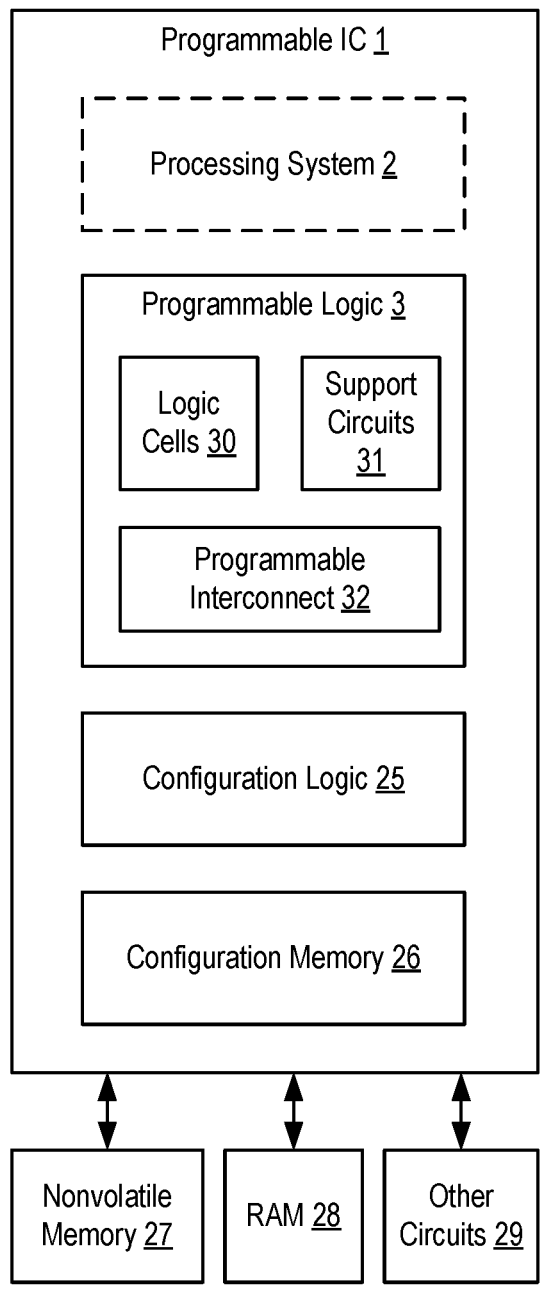
FIG. 11 is a block diagram depicting a programmable IC according to an example that can be used as an implementation of the SoC shown in FIG. 1.

FIG. 11 is a block diagram depicting a programmable IC 1 according to an example that can be used as an implementation of the device 100 shown in FIG. 1. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells 30 and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 12:
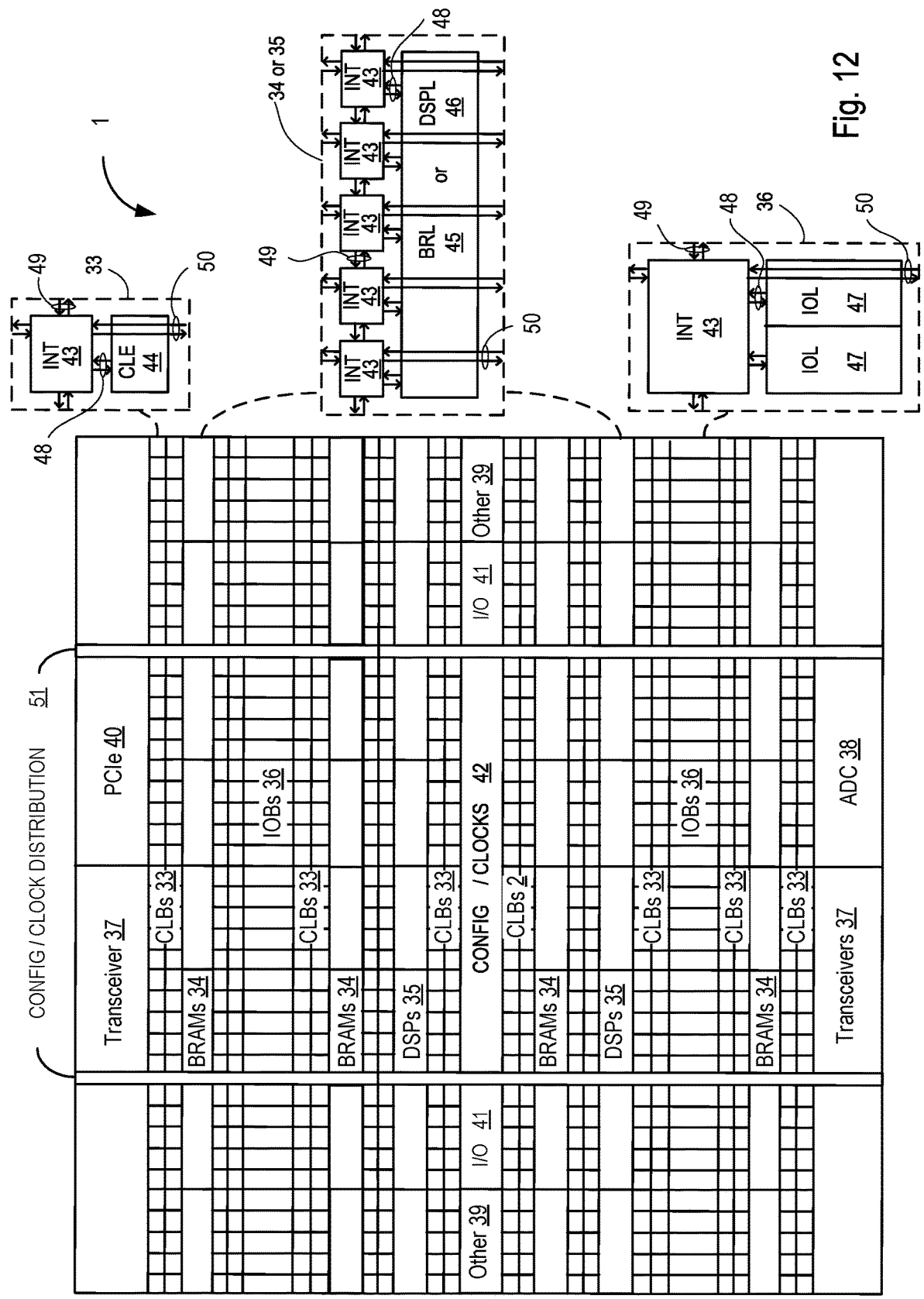
FIG. 12 illustrates a field programmable gate array (FPGA) implementation of the programmable IC of FIG. 5 according to an example.

FIG. 12 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 12. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 12) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 12 include additional logic blocks that disrupt the regular columnar structure making up a large part of the FPGA. The additional logic blocks can be programmable blocks and/or dedicated logic.

Note that FIG. 12 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 12 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A data processing engine (DPE) for a DPE array in an integrated circuit (IC), comprising:
    a core;
    a memory including a data memory and a program memory, the program memory coupled to the core, the data memory coupled to the core and including at least one connection to a respective at least one additional core external to the DPE, the data memory including a plurality of random access memory (RAM) banks;
    support circuitry including hardware synchronization circuitry, direct memory access (DMA) circuitry, and arbitration logic each coupled to the data memory; and
    a stall circuit coupled to the arbitration logic and the core, the stall circuit configured to stall or resume the core in response to one or more inputs including an input from the arbitration logic that is indicative of a memory collision in the data memory between the core and one or more other cores in the DPE array, the stall circuit further configured to stall or resume one or more of the plurality of RAM banks that provide data to the core.

2. The DPE of claim 1, wherein the arbitration logic is configured to arbitrate access to the data memory, wherein the stall circuit includes an input coupled to the arbitration logic.

3. The DPE of claim 2, wherein wherein the arbitration logic is configured to arbitrate access to the plurality of RAM banks.

4. The DPE of claim 1, wherein the stall circuit includes an input coupled to an external processing system in the IC.

5. The DPE of claim 1, further comprising streaming interconnect coupled to the DMA circuitry and the data processing engine, wherein the stall circuit includes an input coupled to a streaming switch in the streaming interconnect.

6. The DPE of claim 5, wherein the input of the stall circuit coupled to the streaming switch is configured to receive a signal indicative of status of a first-in-first-out (FIFO) in the streaming switch.

7. The DPE of claim 1, further comprising a register, wherein the stall circuit includes an input coupled to the register.

8. The DPE of claim 7, further comprising memory-mapped interconnect coupled to the core, the memory, and the support circuitry, wherein the register is coupled to the memory-mapped interconnect.

9. The DPE of claim 1, wherein the support circuitry further includes debug circuitry, and wherein an input of the stall circuit is coupled to the debug circuitry.

10. The DPE of claim 1, wherein the stall circuit includes an input coupled to the hardware synchronization circuitry.

11. The DPE of claim 1, wherein the stall circuit is further coupled to the memory and is configured to stall and resume one or more blocks of the memory.

12. A method of operating a data processing engine (DPE) for a DPE array in an integrated circuit (IC), the method comprising:
    operating a core and a memory in the DPE, the memory including a data memory and a program memory, the program memory coupled to the core, the data memory coupled to the core and including at least one connection to a respective at least one additional core external to the DPE, the data memory including a plurality of random access memory (RAM) banks;
    stalling the core, and one or more RAM banks of the plurality of RAM banks that provide data to the core, using a stall circuit coupled to the core and the memory in response to one or more inputs by asserting a stall signal based on an indication of a memory collision by arbitration logic configured to arbitrate access to the data memory; and
    resuming the core and the one or more RAM banks using the stall circuit.

13. The method of claim 12, wherein the step of stalling comprises:
    asserting a stall signal based on an instruction from an external processing system.

14. The method of claim 12, wherein the step of stalling comprises:
    asserting a stall signal based on an indication of status of a first-in-first-out (FIFO) in a streaming switch in a streaming interconnect coupled to the core and the memory.

15. The method of claim 12, wherein the step of stalling comprises:
    asserting a stall signal based on output of a register.

16. The method of claim 12, wherein the step of stalling comprises:
asserting a stall signal based on an event output from debug circuitry.

17. The method of claim 12, wherein the step of stalling comprises:
asserting a stall signal based on lock status from hardware synchronization circuitry coupled to the memory.

18. The method of claim 12, wherein the step of resuming comprises:
de-asserting a stall signal based on resolution of each asserted stall condition.

19. An integrated circuit (IC), comprising:
a data processing engine (DPE) array having a plurality of DPEs, each of the plurality of DPEs comprising:
  a core;
  a memory including a data memory and a program memory, the program memory coupled to the core, the data memory coupled to the core and including at least one connection to a respective at least one additional core external to the DPE, the data memory including a plurality of random access memory (RAM) banks;
support circuitry including hardware synchronization circuitry, direct memory access (DMA) circuitry, and arbitration logic each coupled to the data memory; and
a stall circuit coupled to the arbitration logic and the core, the stall circuit configured to stall or resume the core in response to one or more inputs including an input from the arbitration logic that is indicative of a memory collision in the data memory between the core and one or more other cores in the DPE array, the stall circuit further configured to stall or resume one or more of the plurality of RAM banks that provide data to the core.

* * * * *

UNITED STATES PATENT AND TRADEMARK OFFICE
CERTIFICATE OF CORRECTION

PATENT NO. : 10,579,559 B1
APPLICATION NO. : 15/944303
DATED : March 3, 2020
INVENTOR(S) : Goran Hk Bilski Page 1 of 1

It is certified that error appears in the above-identified patent and that said Letters Patent is hereby corrected as shown below:

In the Claims

Column 14, Line 1 Claim 3, before "the arbitration" delete "wherein".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*